United States Patent
Wilson et al.

(10) Patent No.: US 7,977,981 B2
(45) Date of Patent: Jul. 12, 2011

(54) PRE-DRIVER CIRCUIT USING TRANSISTORS OF A SINGLE CHANNEL TYPE

(75) Inventors: Christopher Wilson, Ft. Collins, CO (US); Daniel Alan Berkram, Ft. Collins, CO (US)

(73) Assignee: Helwett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/424,473

(22) Filed: Apr. 15, 2009

(65) Prior Publication Data

US 2009/0201070 A1   Aug. 13, 2009

Related U.S. Application Data

(62) Division of application No. 11/906,010, filed on Sep. 29, 2007, now Pat. No. 7,567,097.

(51) Int. Cl.
*H03K 3/00* (2006.01)

(52) U.S. Cl. .................................. 327/108; 327/112

(58) Field of Classification Search ............ 327/308, 327/309, 108–112
See application file for complete search history.

(56) References Cited

U.S. PATENT DOCUMENTS

| | | | |
|---|---|---|---|
| 5,903,142 A * | 5/1999 | Mann | 323/313 |
| 6,166,969 A * | 12/2000 | Song et al. | 365/189.11 |
| 6,696,865 B2 * | 2/2004 | Horiguchi et al. | 326/121 |
| 7,301,370 B1 * | 11/2007 | Hanna et al. | 326/68 |
| 7,429,877 B2 * | 9/2008 | Arsovski et al. | 326/83 |
| 7,567,094 B2 * | 7/2009 | Shastri | 326/58 |
| 7,567,097 B2 * | 7/2009 | Wilson et al. | 327/108 |

* cited by examiner

*Primary Examiner* — Kenneth B. Wells

(57) ABSTRACT

A serial interface apparatus comprises a driver for generating a differential communication signal and a pre-driver for driving the driver circuit. The pre-driver receives an input signal that alternates between VDD and ground and produces an output signal that alternates between a lower limit that is greater than ground and an upper limit that is less than VDD. The pre-driver comprises input circuitry and actuation circuitry, and the actuation circuitry comprises transistors of a single channel type.

18 Claims, 4 Drawing Sheets

PRE-DRIVER CIRCUIT USING TRANSISTORS OF A SINGLE CHANNEL TYPE

CROSS-REFERENCE TO RELATED APPLICATION

This patent application is a divisional application of and claims priority to Ser. No. 11/906,010, now U.S. Pat. No. 7,567,097, filed Sep. 29, 2007, entitled, "Pre-Driver Circuit and Apparatus Using Same," and incorporated herein by reference.

BACKGROUND

Differential signaling is a method of transmitting information electrically by means of two complementary signals sent on two separate traces in which a receiving device reads the difference between the two signals. Since the receiver ignores the traces' voltages with respect to ground, small changes in ground potential between transmitter and receiver do not affect the receiver's ability to detect the signal.

A driver is generally used to provide a differential signal for transmission to a receiver. A large number of factors may affect the quality and characteristics of the signal produced, such as skew, reflections, pattern-dependent interference, propagation delays, and coupled noise, among others. Noise may be coupled onto a signal from a number of sources and may vary as the frequency of the signal varies. Reflections may radiate back and forth on a transmission line due to termination impedance mismatches and may also be dependent on the frequency of the signal. Crosstalk is induced by the electromagnetic fields generated by nearby signals, producing impedance changes in components and transmission lines. A pre-driver may modify the input signal used by the driver in order to improve the characteristics and/or quality of the communication signal.

BRIEF DESCRIPTION OF THE DRAWINGS

For a detailed description of exemplary embodiments of the invention, reference will now be made to the accompanying drawings in which.

DETAILED DESCRIPTION

Figure 1A:
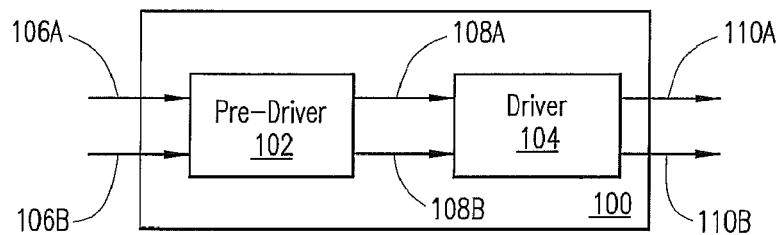
FIG. 1A illustrates an exemplary apparatus including a driver and a pre-driver in accordance with an embodiment of the present disclosure.

Representative embodiments of the present patent disclosure will now be described with reference to various examples wherein like reference numerals are used throughout the description and several views of the drawings to indicate like or corresponding parts, and further wherein the various elements are not necessarily drawn to scale.

With reference to FIG. 1A, an apparatus according to an embodiment of the present disclosure is illustrated and generally designated 100. In at least some embodiments, apparatus 100 may be a serial input/output interface. Apparatus 100 receives a digital input signal 106, which is a differential signal containing complementary input signals 106A, 106B. With respect to each of complementary input signals 106A, 106B, the potential may alternate between a given voltage VDD and a ground voltage. Driver 104 uses the differential input signal to provide a differential digital communication signal, composed of complementary signals 110A, 110B. In some situations, it may be advantageous to modify differential input signal 106 before the signal reaches driver 104. For example, it may be desirable that the signal stays away from the rails, VDD and ground, by a given amount. Pre-driver 102 may be used to modify complementary input signals 106A, 106B and to create complementary output signals 108A, 108B for use by driver 104.

Figure 1B:
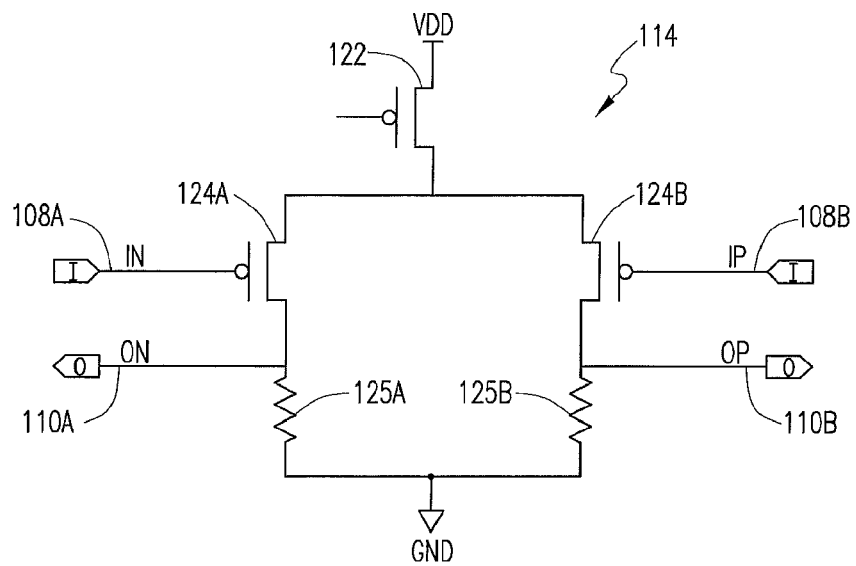
FIG. 1B illustrates an exemplary driver that can be driven by a pre-driver according to one embodiment.

FIG. 1B illustrates a simplified embodiment of a driver corresponding to driver 104 and is generally designated 114. In one embodiment, driver 114 may be a current mode logic (CML) type driver used in a high-speed serial port. In another embodiment, driver 114 may be a host clock signaling level (HCSL) type driver. Generally, such drivers may be utilized in an input/output (I/O) interface circuit of a communication path, such as a high speed serial link, for example. Driver 114 receives a current source controlled by transistor 122. Driver 114 also receives differential digital input signals IN 108A and IP 108B, which drive transistors 124A and 124B respectively. The outputs from driver 114 are differential output signals ON 110A and OP 110B. Loads 125A and 125B are shown here as resistors. One skilled in the art would understand that loads 125A, 125B may also be active switching devices such as field effect transistors. In the circuit shown, if differential input signals IN 108A and IP 108B are allowed to go all the way to VDD and ground, some characteristics of the driver and of the signal that the driver produces may be adversely affected. A pre-driver, such as pre-driver 102 may advantageously be used to modify the incoming signal so that the signal received in driver 114 will not go as high as VDD or as low as ground.

Figure 2:
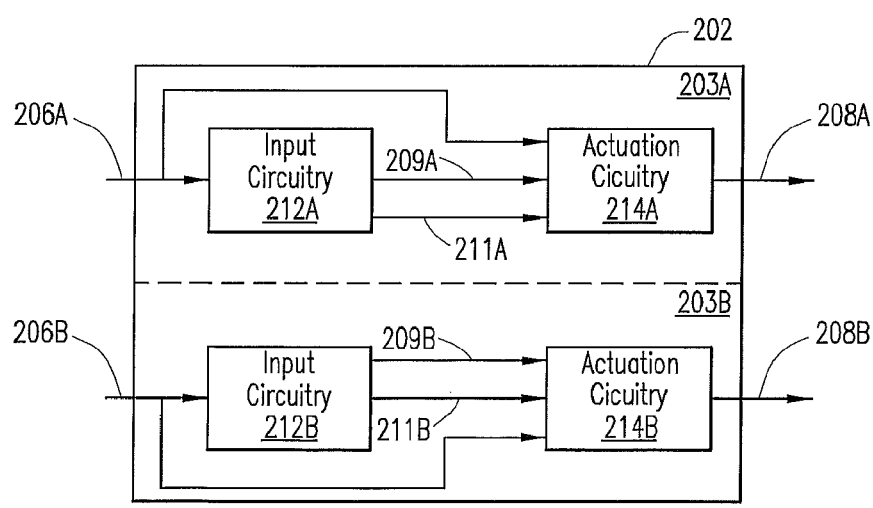
FIG. 2 shows a block diagram of a pre-driver according to an embodiment of the present disclosure.

FIG. 2 illustrates a pre-driver 202 that may be used in device/apparatus 100 as pre-driver 102. When a differential digital input signal, comprising complementary signals 206A, 206B, is received in pre-driver 202, each complementary signal 206A, 206B may be modified in separate but identical circuits 203A, 203B. In further describing circuits 203A, 203B, the discussion will refer only to components of circuit 203A for convenience; it should be understood that the discussion applies equally to the components of circuit 203B, mutatis mutandis. Circuit 203A may contain two sub-circuits—input circuitry 212A and actuation circuitry 214A— and provide digital output signal 208A. Input signal 206A can be provided to input circuitry 212A and to actuation circuitry 214A. Additionally, signals 209A and 211A can be provided to the actuation circuitry 214A by input circuitry 212A. Signal 209A may be an inverted form of signal 206A and signal 211A may be an inverted form of signal 209A.

Within actuation circuitry 214A, all of the transistors advantageously have the same channel type. The specific channel type can be dependent upon the type of logic circuit in which pre-driver 202 is used. For example, if pre-driver 202 is used to drive a CML type driver used in a high-speed serial port, all of the transistors in actuation circuitry 214A may be n-channel devices, such as n-type field effect transistors (N-FETs). In another embodiment, if pre-driver 202 is used to drive an HCSL type driver, all of the transistors in actuation circuitry 214A may be p-channel devices, such as p-type field effect transistors (P-FETs). Designing these transistors to be of a single channel type may provide several advantages, for example, the transistors may generally be matched to each other more easily when the transistors are of the same type and are acted on by the same processing steps during fabrication.

Figure 3A:
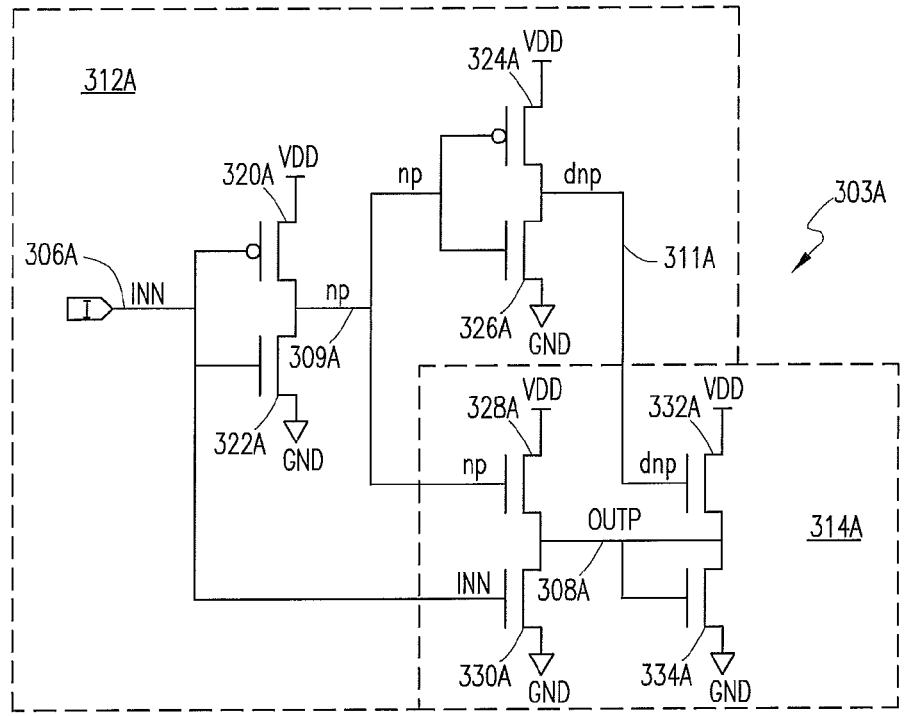
FIG. 3A illustrates input circuitry and actuation circuitry to produce a first of two complementary signals according to an embodiment of the present disclosure.

Referring now to FIG. 3A, an embodiment of circuit portion 203A is shown and designated 303A. Circuit 303A, comprising input circuitry 312A and actuation circuitry 314A, is operable to receive input signal INN 306A and provide output signal OUTP 308A. Signal INN 306A is one signal of a complementary pair of digital input signals and signal OUTP 308A is one signal of a complementary pair of digital output signals. Within input circuitry 312A, signal INN 306A is received at a first inverter including CMOS FETs 320A and 322A. Signal INN is inverted to become signal np 309A, the latter signal being provided to actuation circuitry 314A. Signal np 309A is received at a second inverter composed of CMOS transistors 324A and 326A. Signal 309A is inverted by the second inverter to become signal dnp 311A, which is provided to actuation circuitry 314A.

Actuation circuitry 314A comprises four transistors arranged as two stacks of transistors. For purposes of the present patent application, a stack of transistors refers to two transistors connected in series and sharing a single channel type. A first stack of transistors comprises transistors 328A and 330A. Within the first stack, first transistor 328A is activated by gate signal np 309A and second transistor 330A is activated by gate signal INN 306A. It will be recalled that np 309A is signal INN 306A inverted, so when transistor 328A turns on, transistor 330A turns off and when transistor 328A turns off, transistor 330A turns on. A second stack of transistors includes transistors 332A and 334A. Within the second stack, first transistor 332A is activated by gate signal dnp 311A, while the gate of second transistor 334A is tied to output signal OUTP 308A. Signal dnp 311A is the output from the second inverter and is the same as signal INN, but delayed slightly, e.g., by two inverter delays. This slight delay may advantageously be used when OUTP 308A is being pulled to a rail, as will be discussed hereinbelow.

Figure 3B:
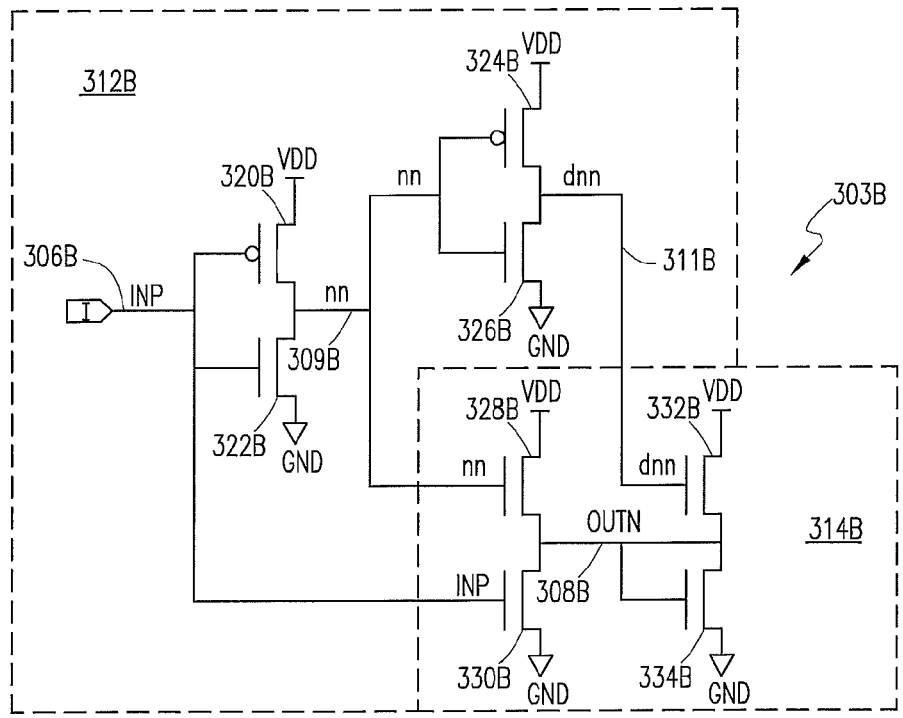
FIG. 3B illustrates input circuitry and actuation circuitry to produce a second of two complementary signals according to an embodiment of the present disclosure.

Referring next to FIG. 3B, circuit 303B contains input circuitry 312B and actuation circuitry 314B, wherein circuit 303B is operable to receive input signal INP 306B and provide output signal OUTN 308B. Circuit 303B is essentially identical to circuit 303A, but carries the complementary signals. INP 306B is the complement to INN 306A and is inverted by a first inverter comprising CMOS transistors 320B and 322B to form first inverted signal nn 309B, which is also the complementary signal to np 309A. Signal nn 309B is inverted by a second inverter including CMOS transistors 324B and 326B to create a second inverted signal, dnn 311B, which is also the complementary signal to dnp 311A. In the first stack of transistors, signal nn 309B is connected to the gate of first transistor 328B and signal INP 306B is connected to the gate of second transistor 330B. In the second stack of transistors, signal dnn 311B is connected to the gate of first transistor 332B and like counterpart signal 311A ensures that transistor 332B turns on two inverter delays after transistor 330B is turned on by signal INP 306B. Output signal OUTN 308B, which is the complementary signal to OUTP 308A is connected to the gate of second transistor 334B of the second stack. The operation of circuits 303A and 303B will be discussed herein below. As alluded to previously, in one embodiment of the present disclosure, circuits 303A and 303B may be incorporated into a CML I/O interface, wherein circuits 314A and 314B are composed of only N-FET devices.

Figure 4A:
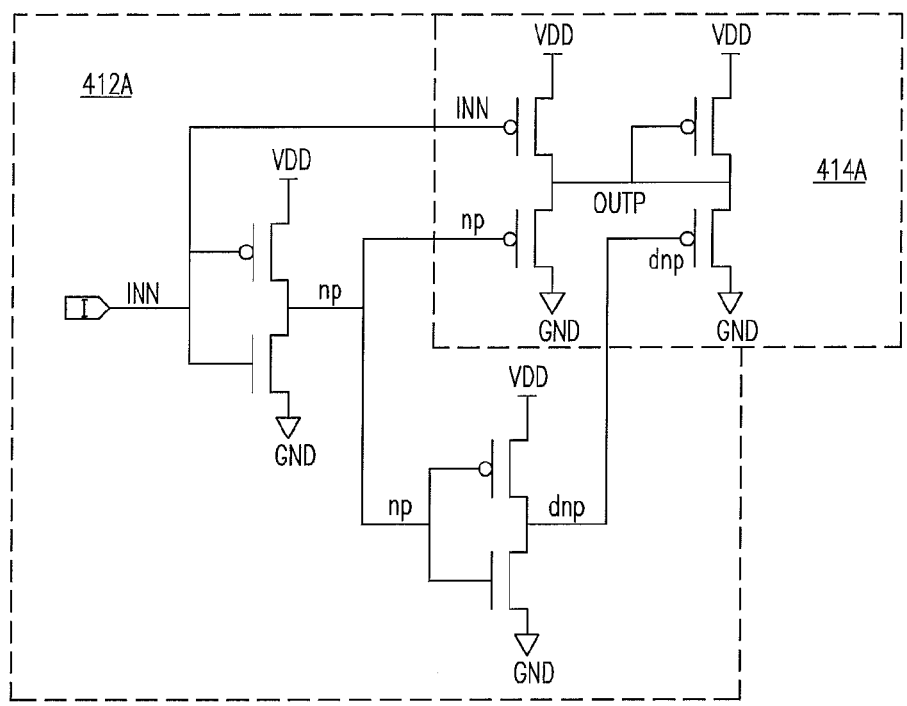
FIG. 4A illustrates input circuitry and actuation circuitry to produce a first of two complementary signals according to another embodiment of the present disclosure.
Figure 4B:
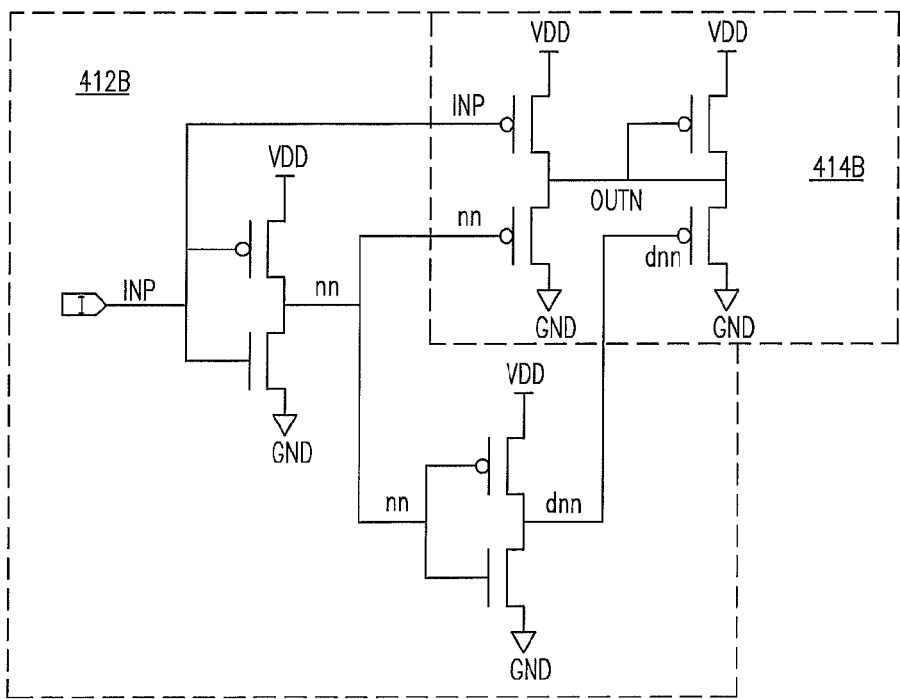
FIG. 4B illustrates input circuitry and actuation circuitry to produce a second of two complementary signals according to another embodiment of the present disclosure.

With reference now to FIGS. 4A and 4B, another embodiment of the present disclosure is shown. In this embodiment, the circuits of FIGS. 4A and 4B are similar to the embodiments shown in FIGS. 3A and 3B, but these circuits are configured to operate in a system that may use an HCSL interface and their connections are therefore somewhat modified. The circuits of FIGS. 4A and 4B respectively disclose input circuitry 412A, 412B and actuation circuitry 414A, 414B. Similar to the description set forth hereinabove, the circuitry of FIGS. 4A and 4B will each receive one of complementary input signals INN, INP and will provide complementary output signals OUTP, OUTN. Input circuitry 412A and 412B each include a first inverter operable to invert the input signal to produce a first inverted signal and a second inverter operable to invert the first inverted signal to produce a second inverted signal. The three signals seen in input circuitry 412A and 412B, e.g. INN, np and dnp in circuit 412A and INP, nn, and dnn in circuit 412B, are each supplied to respective actuation circuitry portions 414A and 414B, with appropriate modifications to the signal that drives each transistor. In the present embodiment, each of the transistors that are connected together in actuation circuitry 414A, 414B is a p-channel device, rather than an n-channel device, as in the earlier embodiment. Accordingly, in this embodiment, circuits 414A and 414B are comprised of only P-FET devices. One of ordinary skill in the art would recognize that the operation of circuits 412A/414A and 412B/414B is essentially the same as that of circuits 312A/314A and 312B/314B, with appropriate changes to the polarity of signals, the sizing of transistors, etc.

Figure 5A:
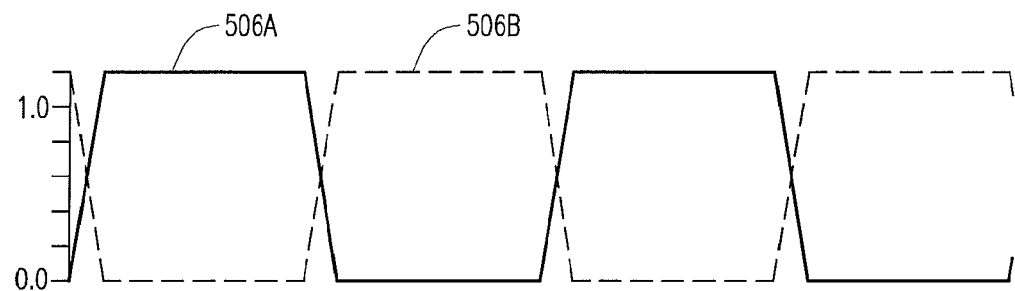
FIG. 5A illustrates a differential input signal that may be received by a pre-driver according to an embodiment of the present disclosure.
Figure 5B:
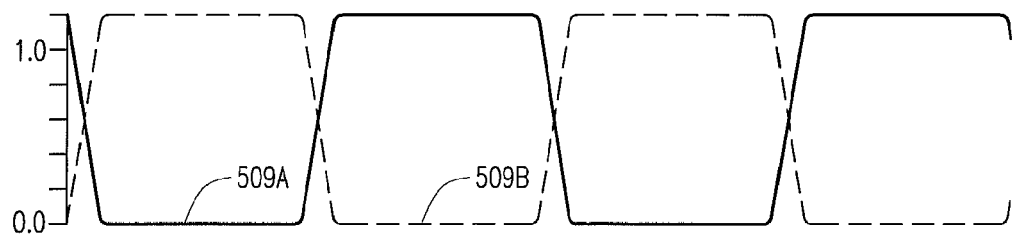
FIG. 5B illustrates a differential inverted signal that may be generated in a pre-driver according to an embodiment of the present disclosure.
Figure 5C:
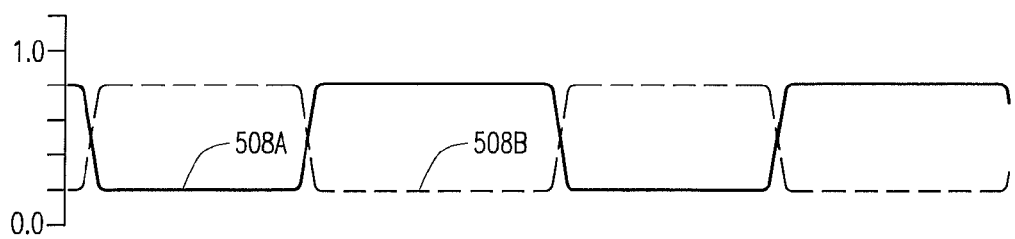
FIG. 5C illustrates a differential output signal that may be produced by a pre-driver according to an embodiment of the present disclosure.

Referring next to FIGS. 5A, 5B, and 5C, traces are shown of specific signals that may be either used by or produced in the embodiment of FIGS. 3A, 3B. Circuits 312A and 312B are implemented using CMOS, while circuits 314A and 314B are composed entirely of N-FETs. In FIG. 5A, reference numerals 506A and 506B refer to traces of complementary input signal INN 306A, seen as a solid line, and INP 306B, seen as a dashed line. These complementary signals demonstrate a "typical" digital signal in that the voltage of input signals 506A, 506B stay predominately at the rails of the signal, e.g. VDD and ground (GND). In the exemplary signals shown, VDD is 1.2 volts and the ground voltage is 0 volts.

In FIG. 5B, signals np 509A and nn 509B, which result when signals 506A, 506B are inverted at the first inverter, are shown. Since signals 509A and 509B are inversions of signals 506A and 506B, the inverted signals also alternate between VDD at 1.2 volts and ground at 0 volts. The result of passing signals np 509A and nn 509B through respective second inverters is not specifically shown in these Figures. However, it should be realized that signals dnp 311A and dnn 311B are essentially the same as signals INN 506A and INP 506B, except delayed by the small amount of time necessary for the signal to traverse two inverters.

Finally, in FIG. 5C, signals OUTP 508A and OUTN 508B are shown. Output signals OUTP 508A and OUTN 508B show inverted polarity with respect to input signals INN 306A and INP 306B, and do not share the same amplitude. Instead, exemplary output signals 506A, 506B have a lower limit of about 200 millivolts and an upper limit of about 800 millivolts in the illustrated embodiment.

The signals shown are achieved in the following manner, referring in particular to the transistors of FIG. 3A, although the same functionality is also present in the circuitry shown FIG. 3B. As input signal INN 506A goes from low to high, as in the first phase shown in FIG. 5A, the first inverter causes signal np 509A to go from high to low, as shown in FIG. 5B, and the second inverter causes signal dnp 511A to go from low to high. Signal np 509A going low causes transistor 328A to turn off; signal INN 306A going high causes transistor 330A to turn on; and two inverter delays later, as a result, signal dnp 311A is driven high to cause transistor 332A to turn on. The slight delay before transistor 332A turns on may allow transistor 330A to pull the voltage on OUTP 508A down quickly towards ground. As the voltage of OUTP nears the desired level, transistor 332A will turn on and begin to counteract the downward pull of transistor 330A. Generally, N-FET transistor 332A will not turn on until the voltage on OUTP reaches VDD minus the threshold voltage (VT) of transistor 332A, that is, the voltage VGS between gate dnp and source OUTP is equal to VDD−VT. The overdrive voltage (i.e., VGS−VT) of transistor 332A is always less than that of 330A, making transistor 332A relatively weaker than transistor 330A. Additionally, transistor 334A is in parallel with transistor 330A and may contribute a downward pull on OUTP. The voltage at which signal OUTP 508A will stabilize is generally determined by the ratio of the strengths of the two counteracting transistors, 330A and 332A, the properties of which may be designed to provide a desired lower limit (e.g., GND+VT).

In the next phase, as signal INN 506A goes from high to low, the first inverter causes signal np 509A to go from low to high and the second inverter causes signal dnp 311A to go from high to low. As a result, signal INN 506A going low causes transistor 330A to turn off and signal dnp 311A going low causes transistor 332A to turn off. As signal np 509A goes high, transistor 328A will turn on. As an N-FET, transistor 328A will remain on as long as there is a voltage difference greater than the threshold voltage (VT) of transistor 328A between gate voltage np and source voltage OUTP. If OUTP goes higher than VDD−VT, transistor 328A will turn off and stop driving OUTP. Accordingly, OUTP is prevented from going beyond VDD−VT. As OUTP 308A approaches VDD−VT, transistor 328A may fall out of saturation and become weak very quickly, but not be turned off. At the same time, transistor 334A can pull just enough current to keep the output signal OUTP at VDD−VT. Although in the exemplary signals shown in FIGS. 5A-5C the difference between the upper limit and VDD is approximately equal to the difference between the lower limit and ground, this relationship may not be required in all applications. The upper limit and lower limit may each be separately determined and configured as necessary. In other words, the difference between the upper limit and the upper rail (VDD) may determined based on the threshold voltage of the first transistor (transistor 328A) of the first stack of transistors, whereas the difference between the lower limit and the lower rail (GND) may be determined based on a ratio of the strengths of the second transistor (transistor 330A) of the first stack and the first transistor (transistor 332A) of the second stack.

In one exemplary embodiment, transistor 328A is a relatively large transistor operable to pull signal OUTP to VDD quickly, while transistor 334A is relatively small. Because transistor 328A will largely turn itself off, consumption of power is minimized in the phase where transistor 328A is active. In the same exemplary embodiment, although transistors 330A and 332A counteract each other, these transistors are weak, so again little power is consumed. Accordingly, this embodiment may provide a benefit of low power consumption in certain implementations.

Although exemplary signals operable in the embodiment of FIGS. 4A and 4B are not shown, one skilled in the art will recognize that the circuits shown in FIGS. 4A and 4B operate in a manner similar to that discussed with reference to FIGS. 3A and 3B, with polarities reversed appropriately. Input circuitry 412A and 412B are identical to input circuitry 312A and 312B and the inverters will behave identically. The P-FET transistors of actuator circuitry 414A and 414B have the same relationships to each other as do the N-FET transistors in actuator circuitry 314A and 314B and will operate in substantially the same manner.

Based on the foregoing Detailed Description, it may be appreciated that the embodiments set forth herein are directed to a pre-driver and an apparatus containing the same that can provide a digital signal operating between an upper limit that is less than VDD and a lower limit that is greater than ground. The pre-driver may advantageously include actuation circuitry in which all of the transistors have the same channel type.

Although the present patent disclosure has been described with reference to certain exemplary embodiments, it is to be understood that the forms of the embodiments shown and described are to be treated as illustrative only. Accordingly, various changes, substitutions and modifications can be realized without departing from the scope of the present disclosure as set forth in the following claims.

What is claimed is:

1. A serial interface apparatus, comprising:
   a driver for generating a differential communication signal; and
   a pre-driver for driving said driver, said pre-driver receiving an input signal that alternates between VDD and ground and producing an output signal that alternates between a lower limit that is greater than ground and an upper limit that is less than VDD, said pre-driver comprising input circuitry and actuation circuitry, wherein said actuation circuitry comprises transistors of a single channel type;
   wherein said actuation circuitry comprises a first stack comprising first and second transistors;
   wherein said input circuitry comprises a first inverter connected to invert said input signal to produce a first inverted signal; and
   wherein said first inverted signal is connected to a gate of said first transistor of said first stack and said input signal is connected to a gate of said second transistor of said first stack.

2. The serial interface apparatus according to claim 1, wherein said actuation circuitry comprises a second stack comprising first and second transistors, said first stack and said second stack being coupled together to produce said output signal.

3. The serial interface apparatus according to claim 2, wherein the difference between said upper limit and VDD is determined based on the threshold voltage of said first transistor of said first stack of transistors.

4. The serial interface apparatus according to claim 3, wherein the difference between said lower limit and ground is determined based on a ratio of the strengths of a second transistor of said first stack of transistors and the first transistor of said second stack of transistors.

5. The serial interface apparatus according to claim 2, wherein said input circuitry comprises a second inverter connected to invert said first inverted signal to produce a second inverted signal.

6. The serial interface apparatus according to claim 5, wherein said second inverted signal is connected to a gate of said first transistor of said second stack and said output signal is connected to a gate of said second transistor of said second stack.

7. The serial interface apparatus according to claim 1, wherein a difference between said upper limit and VDD is substantially equal to a difference between said lower limit and ground.

8. The serial interface apparatus according to claim 1, wherein said input circuitry comprises first and second input portions that each receives one of a pair of complementary input signals and said actuation circuitry comprises first and second portions that each produces one of a pair of complementary output signals.

9. The serial interface apparatus according to claim 1, wherein said single channel type is n-channel and said driver is a current mode logic (CML) driver.

10. The serial interface apparatus according to claim 1, wherein said single channel type is p-channel and said driver is a host clock signaling level (HCSL) driver.

11. The serial interface apparatus according to claim 1, wherein VDD is about 1.2 volts.

12. The serial interface apparatus according to claim 11, wherein said upper limit is about 0.8 volts.

13. The serial interface apparatus according to claim 11, wherein said lower limit is about 0.2 volts.

14. A serial interface apparatus, comprising:
a driver for generating a differential communication signal; and
a pre-driver for driving said driver, said pre-driver receiving an input signal that alternates between VDD and ground and producing an output signal that alternates between a lower limit that is greater than ground and an upper limit that is less than VDD, said pre-driver comprising input circuitry and actuation circuitry, wherein said actuation circuitry comprises transistors of a single channel type;
wherein the actuation circuitry generates a preliminary signal that is modified by the input circuitry to produce the output signal; and
wherein said actuation circuitry comprises a first stack comprising first and second transistors; and
wherein said input circuitry comprises a first inverter connected to invert said input signal to produce a first inverted signal; and
wherein an inverted version of said input signal is coupled to a gate of said first transistor of said first stack and said input signal is coupled to a gate of said second transistor of said first stack.

15. The serial interface apparatus of claim 14, wherein said preliminary signal comprises a VDD signal that the input circuitry, via time-delaying logic, pulls down to said upper limit.

16. The serial interface apparatus of claim 14, wherein said preliminary signal comprises a ground signal that the input circuitry, via time-delaying logic, pulls up to said lower limit.

17. The serial interface apparatus of claim 14 wherein said actuation circuitry comprises a second stack comprising first and second transistors, said first stack and said second stack being coupled together to produce said output signal, and said output signal is coupled to a gate of said second transistor of said second stack.

18. The serial interface apparatus of claim 17 further comprising an inverter that inverts said inverted version of said input signal to produce a second inverted signal, and said second inverted signal is coupled to a gate of said first transistor of said second stack.

* * * * *

UNITED STATES PATENT AND TRADEMARK OFFICE
CERTIFICATE OF CORRECTION

| | | |
|---|---|---|
| PATENT NO. | : 7,977,981 B2 | Page 1 of 1 |
| APPLICATION NO. | : 12/424473 | |
| DATED | : July 12, 2011 | |
| INVENTOR(S) | : Christopher Wilson et al. | |

It is certified that error appears in the above-identified patent and that said Letters Patent is hereby corrected as shown below:

On the Title page, in field (73), Assignee, in column 1, line 1, delete "Helwett-Packard" and insert -- Hewlett-Packard --, therefor.

Signed and Sealed this

Seventh Day of February, 2012

David J. Kappos
*Director of the United States Patent and Trademark Office*